United States Patent
Cuchet et al.

(10) Patent No.: US 12,092,706 B2
(45) Date of Patent: Sep. 17, 2024

(54) MAGNETIC FIELD SENSOR FOR SENSING A TWO-DIMENSIONAL EXTERNAL MAGNETIC FIELD HAVING A LOW ANISOTROPY FIELD

(71) Applicant: Allegro MicroSystems, LLC, Manchester, NH (US)

(72) Inventors: Léa Cuchet, Moirans (FR); Clarisse Ducruet, Chambéry (FR); Jeffrey Childress, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 154 days.

(21) Appl. No.: 17/597,195

(22) PCT Filed: Jun. 26, 2020

(86) PCT No.: PCT/IB2020/056073
§ 371 (c)(1),
(2) Date: Dec. 29, 2021

(87) PCT Pub. No.: WO2021/001738
PCT Pub. Date: Jan. 7, 2021

(65) Prior Publication Data
US 2022/0308133 A1  Sep. 29, 2022

(30) Foreign Application Priority Data
Jul. 2, 2019 (EP) .................................... 19315051

(51) Int. Cl.
*G01R 33/09* (2006.01)
*G01R 15/20* (2006.01)

(52) U.S. Cl.
CPC ......... *G01R 33/098* (2013.01); *G01R 15/205* (2013.01)

(58) Field of Classification Search
CPC ........................... G01R 33/098; G01R 15/205
See application file for complete search history.

(56) References Cited

U.S. PATENT DOCUMENTS 6,788,502 B1    9/2004   Gill
2011/0031569 A1  2/2011   Watts et al.
(Continued)

OTHER PUBLICATIONS

International Search Report for PCT/IB2020/056073 dated Oct. 21, 2020.
(Continued)

*Primary Examiner* — Stephanie E Bloss
*Assistant Examiner* — Michael A Harrison
(74) *Attorney, Agent, or Firm* — DALY, CROWLEY, MOFFORD & DURKEE, LLP

(57) ABSTRACT

Magnetic field sensor for sensing a two-dimensional external magnetic field, including a magnetic tunnel junction including a reference layer having a fixed reference magnetization, a sense ferromagnetic layer having a sense magnetization, and a tunnel barrier layer between the sense and reference ferromagnetic layers; the sense ferromagnetic layer including a first sense ferromagnetic layer in contact with the tunnel barrier layer, a second sense ferromagnetic layer, and a first non-magnetic layer between the first and second sense ferromagnetic layers; the second sense ferromagnetic layer includes a plurality of multilayer element, each multilayer element including a second non-magnetic layer between two second ferromagnetic sense layers; and wherein the second sense ferromagnetic layer has a thickness equal or less than 12 nm.

5 Claims, 5 Drawing Sheets

(56) References Cited

U.S. PATENT DOCUMENTS

2014/0242418 A1* 8/2014 Shukh .................. G11C 11/161
　　　　　　　　　　　　　　　　　　　　　428/811.1
2018/0269387 A1* 9/2018 Iwata ..................... H01F 41/32

OTHER PUBLICATIONS

Written Opinion for PCT/IB2020/056073 dated Oct. 21, 2020.
González-Guerrero, Miguel et al.: "Influence of the deposition-induced stress on magnetic properties of magnetostrictive amorphous (Fe80Co20)80B20 multilayers with orthogonal anisotropy", Journal of Applied Physics, American Institute of Physics, Dec. 18, 2007, pp. 123903-1-123903-4, vol. 102, XP012105217.
Japanese Office Action (with English Translation only) dated Jul. 1, 2024 for Japanese Application No. 2021-572390; 8 Pages.

* cited by examiner

MAGNETIC FIELD SENSOR FOR SENSING A TWO-DIMENSIONAL EXTERNAL MAGNETIC FIELD HAVING A LOW ANISOTROPY FIELD

FIELD

The present invention relates to a tunnel magnetoresistance device and to a magnetic field sensor using the tunnel magnetoresistance effect. More particularly, the present invention concerns a magnetic field sensor for sensing a two-dimensional external magnetic field having a low anisotropy field.

DESCRIPTION OF RELATED ART

Self-referenced magnetic tunnel junctions can be used to sense magnetic fields, in magnetic sensors or compasses. Self-referenced magnetic tunnel junctions typically comprise a reference layer having a reference magnetization, a sense layer having a sense magnetization and a tunnel barrier layer between the sense layer and the reference layer. During a sensing operation, an external magnetic field aligns the sense magnetization more parallel or more antiparallel to the reference magnetization.

In two-dimensional magnetic sensing, the sense layer has a magnetization which is typically fixed in magnitude, and rotates in the plane parallel to the direction of the magnetization of the reference layer. Typically, the sense layer has a preferred orientation of magnetization in this plane, which is the lowest-energy orientation. The magnetic field $H_k$ corresponding to the energy difference between this lowest-energy orientation and the highest-energy orientation is referred to as the magnetic anisotropy of the sense layer. The signal of the sensor depends on the relative orientation of the sense and reference layers, and angular accuracy (low angular error) depends on the anisotropy of the sense layer being as low as possible in this plane. This minimizes the energy difference between the various planar orientations of the sense layer, and results in a sensor output which mirrors closely the external field direction, resulting in low angular error for the sensor.

Practically however, the sense layer has a finite magnetic anisotropy. The sense magnetization can be subjected to finite stray field from the reference layer. This causes angular errors in the alignment of the sense magnetization in the external magnetic field and thus, in the expected resistance of the magnetic sensor element for a given orientation of external magnetic field. These angular errors limit operational margin of the sensor at low magnitudes of the external magnetic field, since the angular error increases when lowering the magnitude of the external magnetic field.

The accuracy of the angular sensing can thus be improved by reducing the magnetic anisotropy of the sense layer. The magnetic anisotropy of the sense layer can be decreased by increasing the thickness of the sense layer. However, increasing the thickness of the sense layer can result in a non-homogeneous magnetization in the plane of the sense layer, decreasing the performance and increasing the minimum usable field of the magnetic sensor.

SUMMARY

The present disclosure concerns a magnetic field sensor for sensing an external magnetic field, the sensor comprising a magnetic tunnel junction comprising a reference layer having a fixed reference magnetization, a sense ferromagnetic layer having a sense magnetization, and a tunnel barrier layer between the sense and reference ferromagnetic layers; the sense ferromagnetic layer comprising a first sense ferromagnetic layer in contact with the tunnel barrier layer, a second sense ferromagnetic layer, and a first non-magnetic layer between said first and second sense ferromagnetic layers; said second sense ferromagnetic layer comprises a plurality of multilayer element, each multilayer element including a second non-magnetic layer between two second ferromagnetic sense layers; and wherein said second sense ferromagnetic layer has a thickness equal or less than 20 nm, preferably equal or less than 12 nm. The second non-magnetic layer comprises a refractory metal. The first sense ferromagnetic layer and the second ferromagnetic sense layer are made of a ferromagnetic material that does not comprise a refractory metal.

The present disclosure further concerns a method for manufacturing the magnetic field sensor, the method comprising the steps of:
depositing the reference layer, the tunnel barrier layer, the first sense ferromagnetic layer, the first non-magnetic layer and the second sense ferromagnetic layer;
said depositing the second sense ferromagnetic layer comprising depositing a plurality of multilayer elements including, for each multilayer element, sequentially depositing the second non-magnetic layer between two second ferromagnetic sense layers.

This magnetic field sensor can achieve reduced anisotropy field without having to further increase the thickness of the sense layer.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
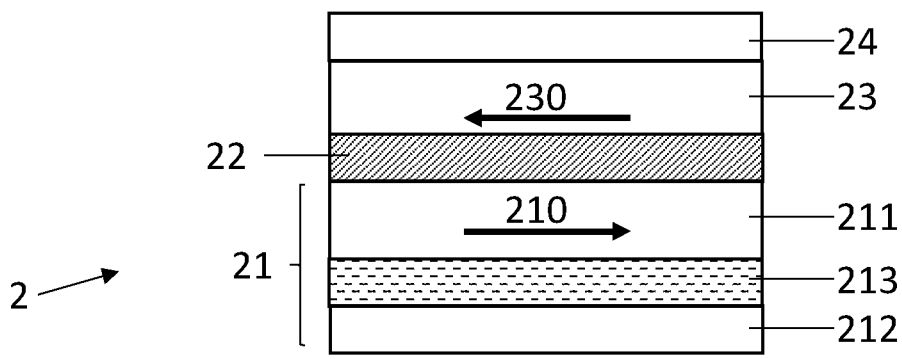
FIG. 1 shows a schematic view of a magnetic tunnel junction comprising a first and second sense layers, according to an embodiment.

FIG. 1 shows a schematic view of a magnetic tunnel junction 2 according to an embodiment. The magnetic tunnel junction 2 comprises a reference layer 23, a sense ferromagnetic layer 21 and a tunnel barrier layer 22 between the sense and reference ferromagnetic layers 21, 23.

The reference layer 23 has a fixed reference magnetization 230 while the sense layer 21 has a sense magnetization 210 that can be freely oriented relative to the reference magnetization 230 in the presence of an external magnetic field. In other words, when magnetic field sensor comprising the magnetic tunnel junction 2 is in the presence of the external magnetic field, the reference magnetization 230 remains substantially fixed while the sense magnetization 210 is deflected in the direction of the external magnetic field.

To that end, the magnetic sensor cell 1 can comprise an antiferromagnetic layer 24 exchange coupling the reference layer 23 such as to pin the reference magnetization 230 at a low temperature threshold $T_L$ and free it at a high temperature threshold $T_H$.

Suitable materials for the antiferromagnetic layer 24 can include transition metals and their alloys. For example, suitable antiferromagnetic materials include alloys based on manganese (Mn), such as alloys based on iridium (Ir) and Mn (e.g., IrMn); alloys based on Fe and Mn (e.g., FeMn); alloys based on platinum (Pt) and Mn (e.g., PtMn); and alloys based on Ni and Mn (e.g., NiMn). In some instances, the high temperature threshold $T_H$, of alloys based on Ir and Mn (or based on Fe and Mn) can be in the range of about 120° C. to about 220° C. or about 150° C. to about 200° C., such as about 200° C., and can be smaller than the high temperature threshold $T_H$ of alloys based on Pt and Mn (or based on Ni and Mn), which can be in the range of about 300° C. to about 350° C. Suitable materials for the antiferromagnetic layer 24 can further include oxide layers, such as NiO.

In a possible configuration, the antiferromagnetic layer 24 have a thickness of about 10 nm or 12 nm. Alternatively, the antiferromagnetic layer 24 can comprise a multilayer wherein each layer has a thickness between 1 and 2 nm.

The reference layer 23 can comprise one or a plurality of ferromagnetic layers (not represented), each ferromagnetic layer comprising Co, Fe, Ni, CoFeB or their alloys. The reference layer 23 can further comprise a synthetic antiferromagnet (SAF) comprising at least two of the ferromagnetic layers, two ferromagnetic layers being separated by a non-magnetic layer where the ferromagnetic layers farthest from the tunnel barrier layer 22 are pinned by an antiferromagnet while the other ferromagnetic layers are coupled to the neighbouring ferromagnetic layers by an RKKY coupling mechanism through the non-magnetic layers separating them. The non-magnetic layer can comprise Ru, Ir or Cu or a combination thereof.

The tunnel barrier 22 can comprise, or be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 3 nm. An optimal thickness of the tunnel barrier 22 can be obtained by inserting a plurality (double or multilayer) of MgO (or another suitable oxide or insulating material) layers.

The sense ferromagnetic layer 21 comprises a first sense ferromagnetic layer 211 in contact with the tunnel barrier layer 22, a second sense ferromagnetic layer 212, and a first non-magnetic layer 213 between said first and second sense ferromagnetic layers 211, 212.

As shown in FIG. 1, the sense magnetization 210 is orientable in the plane of the sense layer 21 in the presence of an external magnetic field. In other words, the sense magnetization 210 remains magnetized in-plane.

The fix (or pinned) reference magnetization 230 of the reference layer 23 is also in-plane, i.e., in the plane of the reference layer 23. In the case the magnetic sensor cell 1 comprises the antiferromagnetic layer 24, the latter has a magnetization being oriented in plane (in the plane of the antiferromagnetic layer 24).

In an embodiment, the second sense ferromagnetic layer 212 comprises a plurality of a multilayer element 216, wherein each multilayer element 216 includes a second non-magnetic layer 215 between two second ferromagnetic sense layers 214.

The purpose of the second non-magnetic layers 215 is to modify the microstructure of the second sense ferromagnetic layer 212 such as to make it finer or even amorphous. The finer or even amorphous structure of the second sense ferromagnetic layer 212 reduces magnetic anisotropy in the sense layer 21 and therefore improve low-field angular error in the two-dimensional magnetic field sensor.

Figure 2:
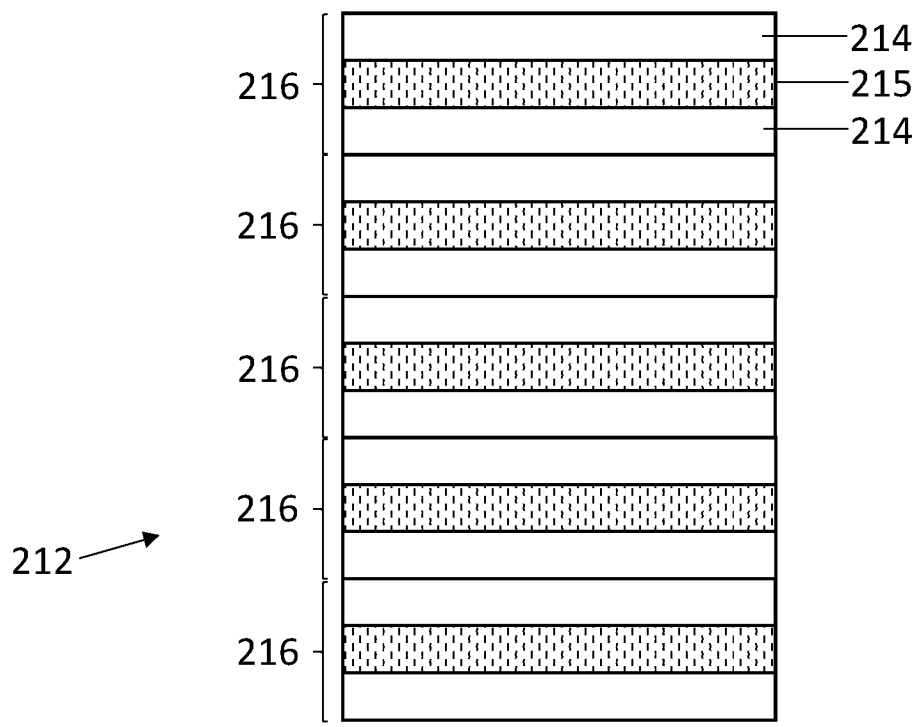
FIG. 2 shows a schematic view of the second sense ferromagnetic layer, comprising a plurality of second non-magnetic layers sandwiched between two second ferromagnetic sense layers, according to an embodiment.

FIG. 2 shows a schematic view of the second sense ferromagnetic layer 212 comprising five multilayer element 216, each comprising, in this sequence, the second non-magnetic layer 215 sandwiched between two second ferromagnetic sense layers 214.

In an embodiment, the structure of the sense layer 21 is as follows:

$$CoFeB_{1.5}/Ta_{0.3}/[NiFe_2/Ta_x]*5/NiFe_2 \quad (1),$$

where the first sense ferromagnetic layer 211 comprises a CoFeB alloy 1.5 nm in thickness, the first non-magnetic layer 213 comprises a Ta layer 0.3 nm in thickness, the second ferromagnetic sense layers 214 comprises a NiFe alloy 2 nm in thickness and the second non-magnetic layer 215 comprises a Ta layer having a thickness x that varies between 0.1 nm and 0.4 nm.

Figure 3:
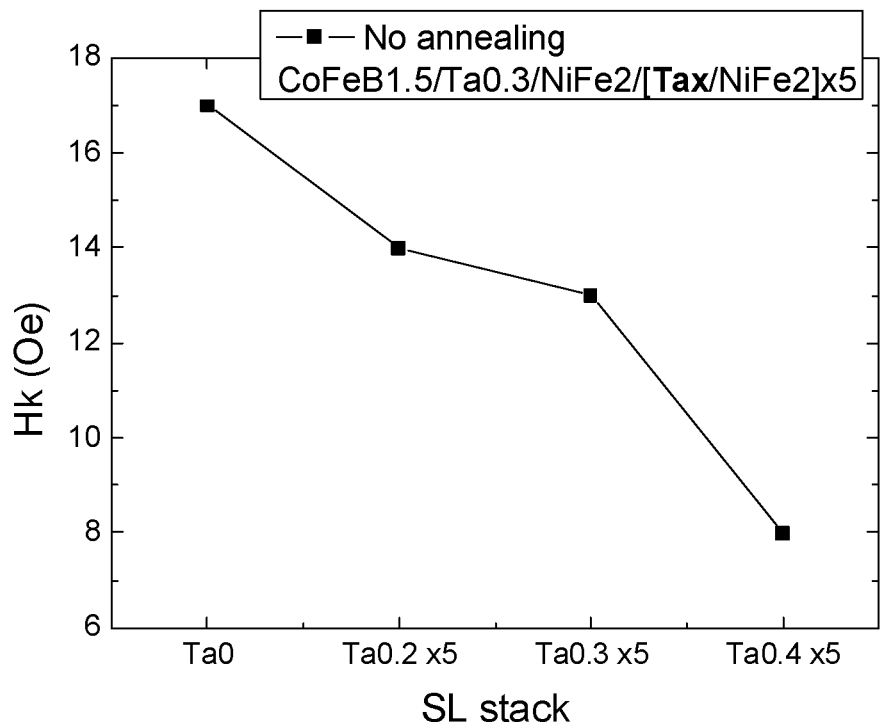
FIG. 3 is a graph showing the relationship between the anisotropy field and the thickness of the second non-magnetic layer.

FIG. 3 is a graph showing the relationship between the anisotropy field $H_k$ and the thickness of the second non-magnetic layer 215. The anisotropy field $H_k$ is also reported for a conventional sense layer 21 having the following structure: $CoFeB_{1.5}/Ta_{0.3}/NiFe_{12}$, without annealing FIG. 3 shows a decrease in anisotropy field $H_k$ with increasing the thickness of the second non-magnetic layer 215. In some embodiments, the sense layer 21 can be annealed at an annealing temperature above 240° C. For example, the sense layer 21 can be annealed at an annealing temperature of 310° C. during 90 min.

Figure 4A:
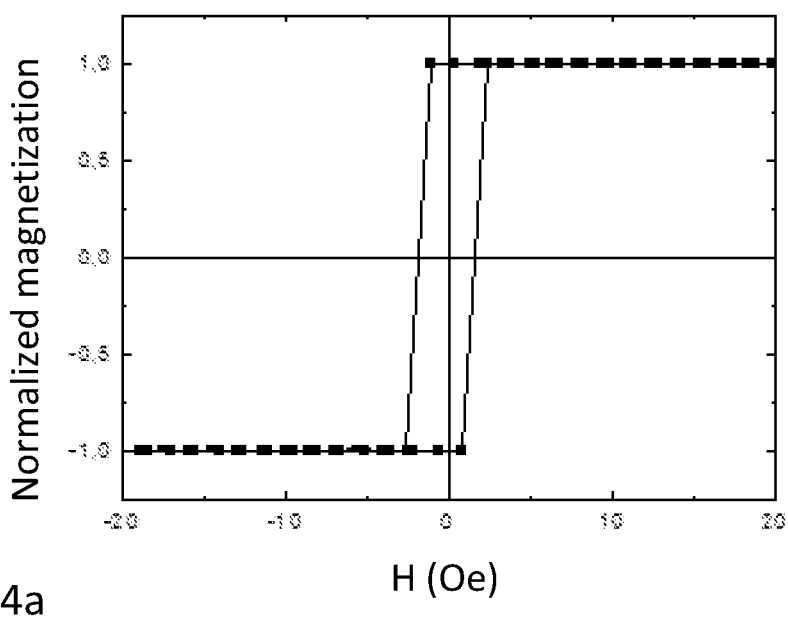
FIGS. 4a-4c report magnetic loop measured in the easy axis and hard axis directions for the sense layer.
Figure 4B:
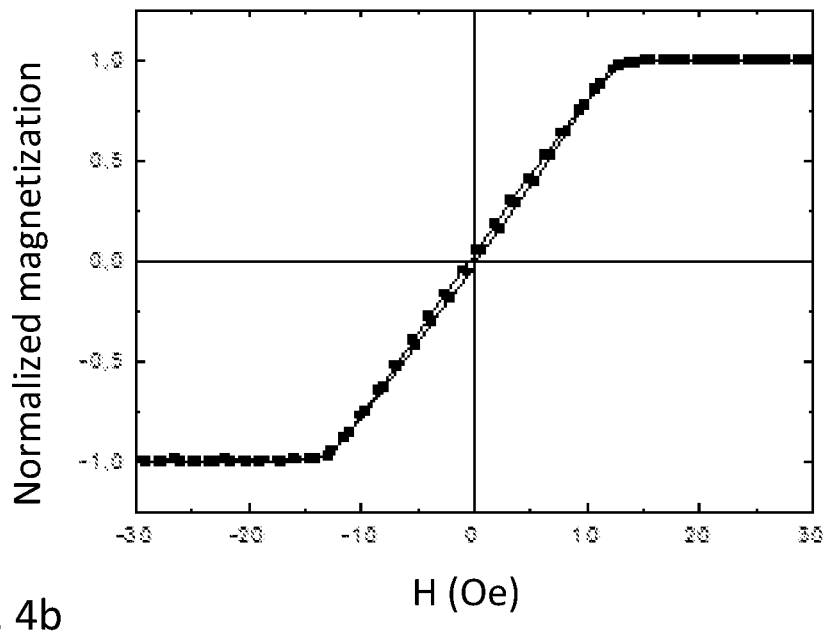
Figure 4C:
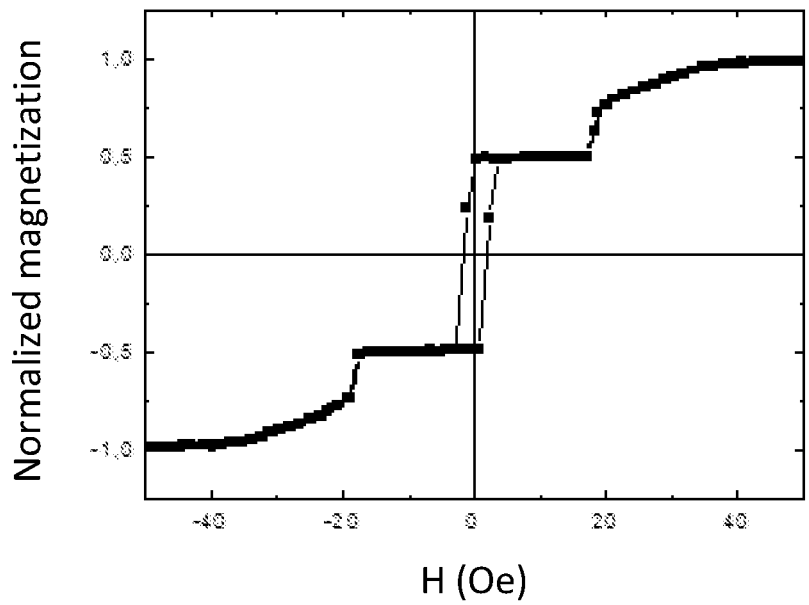

FIG. 4 reports magnetic loop measured in the easy axis (0°) and hard axis (90°) directions for the structure (1) of the sense layer 21. The sense layer 21 was not annealed. In particular, FIGS. 4a and 4b show a magnetic loop for the second non-magnetic layer 215 having a thickness of 0.3 nm and FIG. 4c shows a magnetic loop for the second non-magnetic layer 215 having a thickness of 0.5 nm. In FIGS. 4a and 4c, the magnetic loop measured in the easy axis and yields a coercive field $H_c$ of about 2 Oe. In FIG. 4b, the magnetic loop measured in the hard axis and yields an anisotropy field $H_k$ of about 13 Oe. For the second non-magnetic layer 215 having a thickness of 0.5 nm, antiferromagnetic coupling through the Ta second non-magnetic layer 215 can be seen. In order to avoid such antiferromagnetic coupling the thickness of the second non-magnetic layer 215 should be smaller than 0.5 nm. A thickness between 0.1 nm and 0.4 nm is thus advantageous. In an embodiment, the thickness of the second non-magnetic layer 215 is about 0.3 nm.

Figure 5:
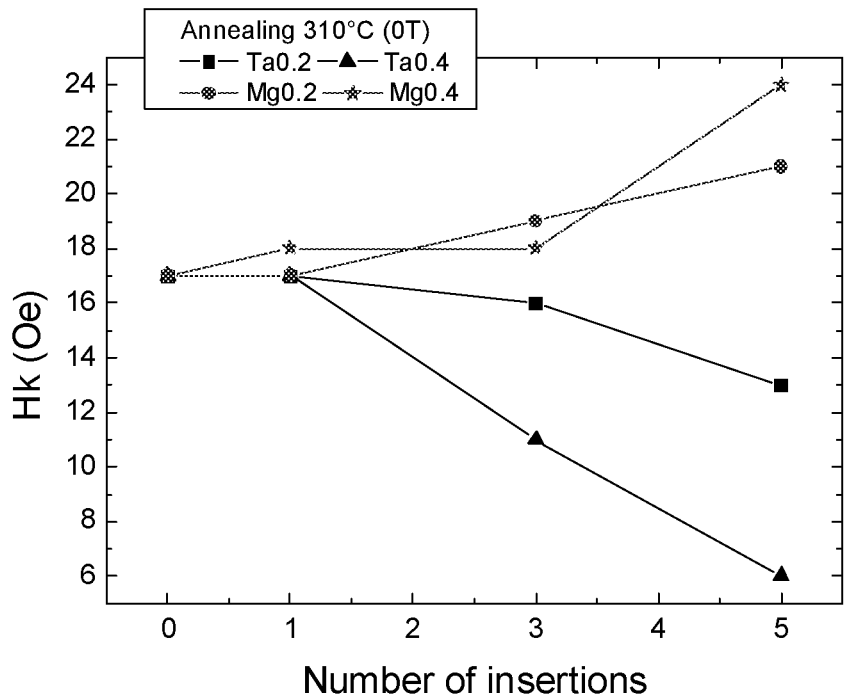
FIG. 5 shows the relationship between the anisotropy field and the number of second non-magnetic layers.

FIG. 5 shows the relationship between the anisotropy field $H_k$ and the number of second non-magnetic layers 215 in the second sense ferromagnetic layer 212, for the structure (1). In particular, the anisotropy field $H_k$ is reported for the first sense ferromagnetic layer 211 made from a CoFeB alloy and the second non-magnetic layer 215 made of Ta or Mg. The first sense ferromagnetic layer 211 has a thickness of about 1.5 nm and the second non-magnetic layer 215 has a thickness of about 0.2 nm or 0.4 nm. The second sense ferromagnetic layer 212 has a thickness of about 12 nm. The sense layer 21 is annealed at 310° C. during 90 min in the absence of a magnetic field. FIG. 5 shows that increasing the number of second non-magnetic layer 215 allows for reducing the anisotropy field $H_k$, in the case of the second non-magnetic layer 215 is made of Ta.

A number of five of second non-magnetic layers 215 for the sense layer 21 yields the lowest anisotropy field $H_k$ and thus, appears to be most favorable configuration. The number of second non-magnetic layers 215 can be greater than five. However, increasing the number of second non-magnetic layer 215 tends to decrease the sense magnetization 210.

Other materials can be used for the first sense ferromagnetic layer 211, the first non-magnetic layer 213, the second ferromagnetic sense layers 214 and the second non-magnetic layer 215, and other thickness for these layers can be contemplated within the scope of the present invention. In general, the second non-magnetic layer 215 can have a thickness that varies between 0.1 nm and 0.4 nm. More particularly, the second non-magnetic layer 215 can have a thickness of about 0.1 nm, 0.2 nm, 0.3 nm or 0.4 nm.

In a variant, the first sense ferromagnetic layer 211 comprise a multilayer structure. For example, the first sense ferromagnetic layer 211 can comprise between 2 to 5 ferromagnetic layers. The first sense ferromagnetic layer 211 can comprises a CoFe, CoFeB, NiFe alloy or any other suitable ferromagnetic alloy.

For example, the second non-magnetic layer 215 can comprise a refractory metal. More particularly, the second non-magnetic layer 215 can comprise one, alone or in combination, of the following metals: Ta, Zr, W, Ti, Mo, Nb, Hf. The second ferromagnetic sense layer 214 can also be made of an CoFe or CoFeB alloy. In general, the second ferromagnetic sense layer 214 can have a thickness between 1 nm and 3 nm and preferably between 1.1 nm and 3 nm or 1.5 nm and 5 nm. This ensures the in-plane magnetization direction that is required for the two-dimensional magnetic sensing of the magnetic field sensor.

Preferably, the second non-magnetic layer 215 comprises Ta. The second non-magnetic layer 215 made of (or comprising) Ta allows for reducing the planar anisotropy field Hk of the first sense ferromagnetic layer 211.

In one aspect, the first sense ferromagnetic layer 211 and the second ferromagnetic sense layer 214 are made of a ferromagnetic material that does not comprise a refractory metal. In particular, the sense ferromagnetic layer 211 and the second ferromagnetic sense layer 214 are made of ferromagnetic material that does not comprise any one of: Ti, V, Cr, Zr, Mn, Nb, Mo, Hf, Tc, Ru, Rh, Ta, W, Re, Os or Ir. Indeed, the presence of such refractory metals in the first sense ferromagnetic layer 211 and/or second ferromagnetic sense layer 214 would promote the perpendicular direction of the first and second sense ferromagnetic layers 211, 214 instead of the in-plane magnetization direction that is required for the two-dimensional magnetic sensing of the magnetic field sensor.

For example, the first sense ferromagnetic layer 211 and the second ferromagnetic sense layer 214 can be made of a CoFe, CoFeB, NiFe-based alloy or any other suitable ferromagnetic alloy (not comprise a refractory metal). Preferably, the first sense ferromagnetic layer 211 is made of a CoFeB-based alloy and the second ferromagnetic sense layer 214 is made of a NiFe-based alloy. The latter configuration allows for further reducing the anisotropy field.

Figure 6:
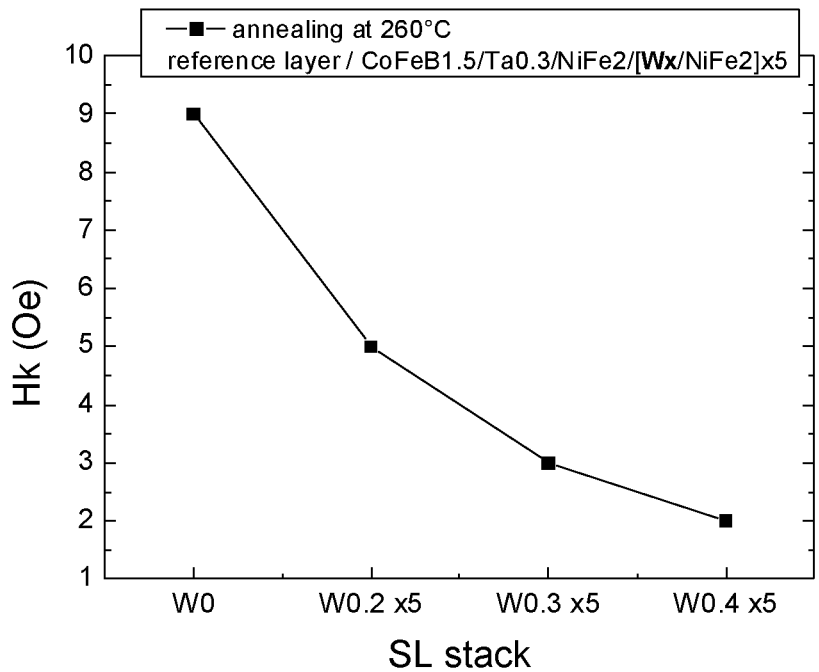
FIG. 6 shows the relationship between the anisotropy field and the thickness of the second non-magnetic layer.

FIG. 6 shows the relationship between the values of anisotropy field $H_k$ and the thickness of the second non-magnetic layer 215 for the structure (1) of the sense layer 21. The second sense ferromagnetic layer 212 comprises five multilayer element 216. The second non-magnetic layer 215 is made of W. The relationship is shown for the sense layer 21 being annealed at 260° C. in the absence of a magnetic field. The annealing can comprise a heating ramp of about 30 min, an annealing plateau (at 260° C.) of about 30 min and a cooling ramp of about 30 min (so that a total duration of the annealing step is about 90 min).

According to an embodiment, a method for manufacturing the magnetic tunnel junction 2, comprising the steps of: using a deposition tool, depositing the reference layer 23, the tunnel barrier layer 22, the first sense ferromagnetic layer 211, the first non-magnetic layer 213 and the second sense ferromagnetic layer 212, on a substrate (not shown). Depositing the second sense ferromagnetic layer 212 comprises depositing a plurality of multilayer elements 216 including, for each multilayer element, sequentially depositing the second non-magnetic layer 215 between two second ferromagnetic sense layers 214.

Figure 7:
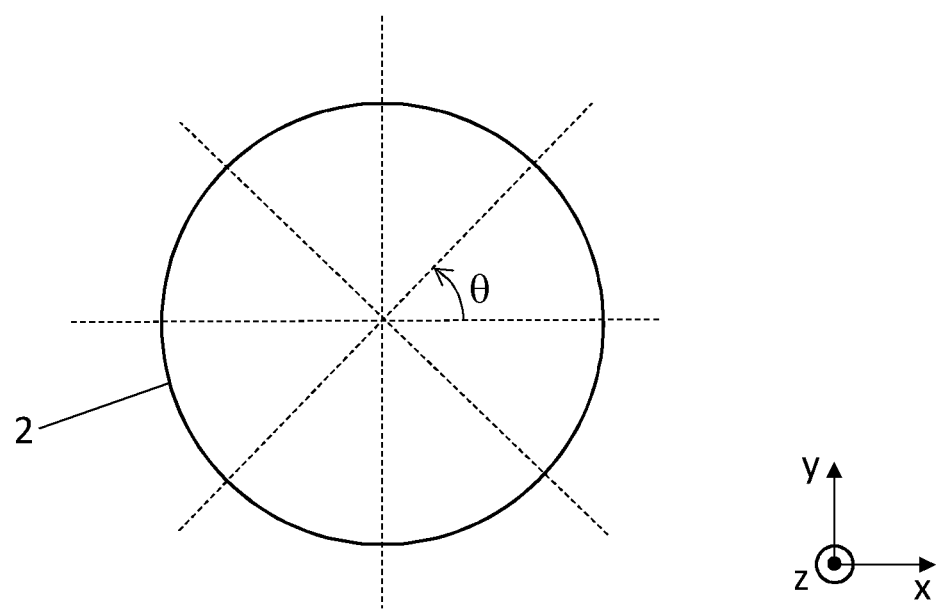
FIG. 7 represents a top view of the magnetic tunnel junction showing different possible deposition angles.

In an preferred embodiment, each multilayer element 216 is deposited with deposition angle θ that differs from the deposition angle of the next multilayer element 212. The deposition angle θ can be defined relative to a reference angle on the substrate on which the multilayer element 216 is deposited. For example, such a reference angle can corresponds to a notch on a wafer. The reference angle can defines the 0° direction used by the deposition tool. FIG. 7 represents a top view of the magnetic tunnel junction 2 showing different possible deposition angles θ.

In a variant, the plurality of multilayer elements 216 are deposited successively with varying the deposition angle θ including 0° and 90°.

In another variant, the plurality of multilayer elements 216 are deposited successively with varying the deposition angle θ including 45° and 135°.

In yet another variant, the plurality of multilayer elements 216 are deposited successively with varying the deposition angle θ including 0°, 45°, 90° and 135°.

Varying the deposition angle θ can also be used when depositing the other layers of the magnetic tunnel junction 2, including the first sense ferromagnetic layer 211, the tunnel barrier layer 22 and the reference layer 23.

Varying the deposition angle θ when depositing the multilayer elements 216 allows for averaging, decreasing the magnetic anisotropy of the sense layer 21. Residual magnetic anisotropy that may remain can be further decreased by introducing the second non-magnetic layers 215.

In some embodiments, the deposition angle θ can be constant or deposition angle θ can be varied in a continuous way, for example by continuously rotating a substrate on which the magnetic tunnel junction layers are deposited.

In various embodiment, the structure of the sense layer 21 can be as follows:

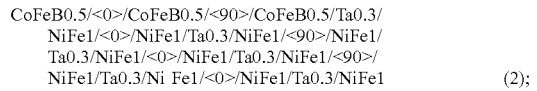

(2);

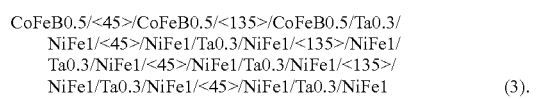

(3).

where the symbols <0>, <45>, <90> and <135> correspond respectively to deposition angle θ of 0°, 90°, 45° and 135°.

Other arrangement of the sense layer 21 structure can be contemplated.

REFERENCE NUMBERS AND SYMBOLS 2 magnetic tunnel junction
21 sense layer
210 sense magnetization
211 first sense ferromagnetic layer
212 second sense ferromagnetic layer
213 first non-magnetic layer
214 second ferromagnetic sense layer
215 second non-magnetic layer
216 multilayer element
22 tunnel barrier layer
23 reference layer
230 reference magnetization
231 ferromagnetic reference layer
232 non-magnetic reference layer
24 pinning layer
θ deposition angle
$H_c$ coercive field
$H_k$ anisotropy field

The invention claimed is:

1. A method for manufacturing a magnetic field sensor comprising a magnetic tunnel junction comprising a reference layer having a fixed reference magnetization oriented in the plane of the reference layer, a sense ferromagnetic layer having a sense magnetization orientable in the plane of the sense ferromagnetic layer, and a tunnel barrier layer between the sense ferromagnetic layer and the reference layer, the sense ferromagnetic layer comprising a first sense ferromagnetic layer in contact with the tunnel barrier layer, a second sense ferromagnetic layer, and a first non-magnetic layer between said first and second sense ferromagnetic layers, wherein said second sense ferromagnetic layer comprises a plurality of multilayer elements, each multilayer element comprising a second non-magnetic layer between two second ferromagnetic sense layers, wherein said second sense ferromagnetic layer has a thickness equal to or less than 20 nm, the method comprising the steps of:

depositing the reference layer, the tunnel barrier layer, the first sense ferromagnetic layer, the first non-magnetic layer, and the second sense ferromagnetic layer, wherein said depositing the second sense ferromagnetic layer comprises depositing the plurality of multilayer elements including, for each multilayer element, sequentially depositing the second non-magnetic layer between two second ferromagnetic sense layers, wherein the first sense ferromagnetic layer and the second sense ferromagnetic layer are made of a ferromagnetic material that does not comprise a refractory metal, and wherein each multilayer element is deposited on a substrate with a deposition angle (θ) that differs from the deposition angle of a subsequent multilayer element;

wherein said deposition angle is defined relative to a reference angle on the substrate on which the multilayer element is deposited.

2. The method according to claim 1, wherein said plurality of multilayer elements are deposited successively with varying the deposition angle between 0° and 90°.

3. The method according to claim 1, further comprising a step of annealing at a temperature above 240° C.

4. The method according to claim 3, wherein the annealing step is performed at about 310° C. for about 90 min.

5. The method according to claim 1, wherein the second sense ferromagnetic layer comprises a NiFe alloy and the first ferromagnetic sense layer comprises a CoFeB alloy.

\* \* \* \* \*

UNITED STATES PATENT AND TRADEMARK OFFICE
CERTIFICATE OF CORRECTION

PATENT NO. : 12,092,706 B2
APPLICATION NO. : 17/597195
DATED : September 17, 2024
INVENTOR(S) : Léa Cuchet et al.

Page 1 of 1

It is certified that error appears in the above-identified patent and that said Letters Patent is hereby corrected as shown below:

In the Specification

Column 5, Line 47, delete "Hk" and replace with --$H_k$--.

Signed and Sealed this
Fourth Day of March, 2025

Coke Morgan Stewart
*Acting Director of the United States Patent and Trademark Office*